US012690176B2

(12) United States Patent
Kögler et al.

(10) Patent No.: US 12,690,176 B2
(45) Date of Patent: Jul. 21, 2026

(54) POWER MODULE HAVING AT LEAST ONE POWER UNIT

(71) Applicant: Siemens Aktiengesellschaft, Munich (DE)

(72) Inventors: Roman Kögler, Nuremberg (DE); Alexander Luft, Nuremberg (DE); Bernd Roppelt, Unterhald (DE); Jens Schmenger, Forchheim (DE); Thomas Schwinn, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 512 days.

(21) Appl. No.: 18/020,887

(22) PCT Filed: Jun. 11, 2021

(86) PCT No.: PCT/EP2021/065770

§ 371 (c)(1),
(2) Date: Feb. 10, 2023

(87) PCT Pub. No.: WO2022/033745

PCT Pub. Date: Feb. 17, 2022

(65) Prior Publication Data

US 2024/0040755 A1 Feb. 1, 2024

(30) Foreign Application Priority Data

Aug. 11, 2020 (EP) .................................... 20190396

(51) Int. Cl.
*H05K 7/20* (2006.01)
*H05K 5/03* (2006.01)
(52) U.S. Cl.
CPC ........... *H05K 7/20909* (2013.01); *H05K 5/03* (2013.01); *H05K 7/20154* (2013.01)

(58) Field of Classification Search
CPC .. H05K 7/20154; H05K 7/2089; H05K 7/209; H05K 7/20909; H05K 5/03
See application file for complete search history.

(56) References Cited

U.S. PATENT DOCUMENTS 4,883,702 A * 11/1989 Sato .......................... C08K 7/14
428/419
6,201,696 B1 3/2001 Shimizu et al.
(Continued)

FOREIGN PATENT DOCUMENTS

CN 1219767 A 6/1999
CN 101855723 A 10/2010
(Continued)

OTHER PUBLICATIONS

JP-2003068979-A Translation (Year: 2003).*
(Continued)

*Primary Examiner* — Jayprakash N Gandhi
*Assistant Examiner* — Matthew Sinclair Muir
(74) *Attorney, Agent, or Firm* — Henry M. Feiereisen LLC

(57) ABSTRACT

A power module includes a power unit. The power unit includes a power semiconductor and a substrate. In order to improve the reliability of the power module, the substrate of the power unit is directly connected in an integrally bonded manner to a surface of a heat sink. The power unit is surrounded at least partially by a housing. The housing includes a housing frame which is connected liquid-tight to the surface of the heat sink and formed from a first dielectric material, and a housing cover which is connected to the housing frame to close the housing and is formed from a second dielectric material.

17 Claims, 2 Drawing Sheets

(56) References Cited

U.S. PATENT DOCUMENTS

| | | | | |
|---|---|---|---|---|
| 8,087,943 B2 * | 1/2012 | Stolze | ................... | H01L 25/072 |
| | | | | 439/83 |
| 8,900,079 B2 * | 12/2014 | Mori | ........................ | F16H 7/18 |
| | | | | 474/140 |
| 9,918,380 B2 * | 3/2018 | Murakami | ........... | H05K 1/0216 |
| 10,273,348 B2 * | 4/2019 | Kim | ....................... | C08K 5/098 |
| 10,381,243 B2 * | 8/2019 | Karasawa | ............... | H01L 21/54 |
| 2001/0038143 A1 * | 11/2001 | Sonobe | ................ | H10W 90/00 |
| | | | | 257/E25.012 |
| 2003/0011057 A1 | 1/2003 | Nakajima et al. | | |
| 2003/0087448 A1 * | 5/2003 | Abe | ...................... | G01F 15/006 |
| | | | | 436/124 |
| 2010/0265744 A1 | 10/2010 | Dorn et al. | | |
| 2014/0167241 A1 * | 6/2014 | Matsuoka | ............... | H01L 23/24 |
| | | | | 257/690 |
| 2014/0233197 A1 * | 8/2014 | Schwab | ................... | H05K 5/03 |
| | | | | 361/752 |
| 2014/0319669 A1 | 10/2014 | Kimijima et al. | | |
| 2017/0316992 A1 | 11/2017 | Spann | | |
| 2019/0237372 A1 * | 8/2019 | Roth | ....................... | H01L 21/56 |
| 2019/0267331 A1 * | 8/2019 | Hatanaka | ............ | H10W 42/121 |
| 2019/0371686 A1 * | 12/2019 | Harada | ................. | H10W 76/47 |

FOREIGN PATENT DOCUMENTS

| | | | |
|---|---|---|---|
| DE | 102013216035 B3 | | 1/2015 |
| DE | 102014104856 A1 | | 10/2015 |
| FR | 2527837 A1 | | 12/1983 |
| JP | 2003068979 A | * | 3/2003 |
| JP | 2014130875 A | | 7/2014 |

OTHER PUBLICATIONS

PCT International Search Report and Written Opinion of International Searching Authority mailed Jul. 10, 2021 corresponding to PCT International Application No. PCT/EP2021/065770 filed Jun. 11, 2021.

\* cited by examiner

Power
Module

2

36 Power Converter

POWER MODULE HAVING AT LEAST ONE POWER UNIT

CROSS-REFERENCES TO RELATED APPLICATIONS

This application Is the U.S. National Stage of International Application No. PCT/EP2021/065770, filed Jun. 11, 2021, which designated the United States and has been published as International Publication No. WO 2022/033745 A1 and which claims the priority of European Patent Application, Serial No. 20190396.0, filed Aug. 11, 2020, pursuant to 35 U.S.C. 119(a)-(d).

BACKGROUND OF THE INVENTION

The invention relates to a power module having at least one power unit.

The Invention also relates to a power converter having at least one such power module.

Furthermore, the invention relates to a method for producing a power module having at least one power unit.

In such power converters, normally closed switch modules, which are currently manufactured in discrete designs, are screwed onto a heat sink, for example via a solid metallic base plate. A power converter is understood to mean, for example, a rectifier, an inverter, a converter or a DC/DC converter.

In such switch modules, due to increasing maximum permissible chip temperatures of the power semiconductor, which are in the range of 175° C. for example, the periphery surrounding the power semiconductor also becomes steadily warmer. This relates in particular to housing which surrounds the power semiconductor and is usually made of a plastic. The increasing temperatures in the interior of switch modules thus also pose a challenge for the housing surrounding the power semiconductor. The use of higher temperature-resistant plastics, for example PPS material, entails other disadvantages. Such higher temperature-resistant plastics have, for example, a high glass fiber content, which makes the material brittle, which leads to the formation of cracks and finally to breakage, in particular under mechanical stress.

Against this background, it is an object of the present invention to improve the reliability of a power module.

SUMMARY OF THE INVENTION

The object is achieved according to the invention by a power module having at least one power unit, which comprises at least one power semiconductor and a substrate, the substrate of the power unit being directly connected in an integrally bonded manner to a surface of a heat sink, the at least one power unit being surrounded at least partially by a housing, the housing comprising a housing frame formed from a first dielectric material and a housing cover formed from a second dielectric material, the first dielectric material differing from the second dielectric material and the housing frame being connected liquid-tight to the surface of the heat sink and the housing being closed by connecting the housing cover to the housing frame.

The object according to the invention is also achieved by a power converter having at least one such power module.

Furthermore, the object according to the invention is achieved by a method for producing a power module having at least one power unit which comprises at least one power semiconductor and a substrate, the substrate of the power unit being directly connected in an integrally bonded manner to a surface of a heat sink, a housing being arranged around the at least one power unit, the housing comprising a housing frame formed from a first dielectric material and a housing cover formed from a second dielectric material, the first dielectric material differing from the second dielectric material, the housing frame being connected liquid-tight to the surface of the heat sink and the housing being closed by connecting the housing cover to the housing frame.

The advantages and preferred embodiments listed below with regard to the power module can be transferred analogously to the power converter and the method.

The invention is based on the consideration to improve the reliability of a power module by means of a housing which at least partially surrounds a power unit of the power module. The power unit has at least one power semiconductor and a substrate. The substrate has a dielectric material layer with a metallization, in particular on both sides. For example, the dielectric material layer is 25 μm to 400 μm, in particular 50 μm to 250 μm, thick and contains a ceramic material, for example aluminum nitride or aluminum oxide, or an organic material, for example a polyamide. The metallization is structured, for example, and made of copper.

The substrate is directly connected in an integrally bonded manner to a surface of a heat sink. A heat sink is understood to mean a metallic base plate which may have cooling fins or other means of increasing the surface. The heat sink is made of, for example, aluminum or an aluminum alloy by extrusion. A direct substance-to-substance bond is understood to mean direct bonding, which includes connecting means for producing the substance-to-substance bond such as adhesive, solder, sintering paste, etc., but excludes an additional connecting element such as an additional conductor, a bonding wire, a spacer, a base plate, heat-conducting paste, etc.

The housing comprises a housing frame and a housing cover, the housing being closed by connecting the housing cover to the housing frame. The housing frame is connected liquid-tight to the surface of the heat sink, so that, for example, a soft encapsulation, in particular a silicone encapsulation, can be provided within the housing frame to protect the power semiconductor. The liquid-tight connection can be produced, for example, adhesively, by non-positive connection or by positive form locking. Due to the connection of the housing frame to the heat sink, a temperature load of the housing is reduced even at high temperatures of the power semiconductor, for example in the range of 175° C.

The housing frame is produced from a first dielectric material and the housing cover from a second dielectric material, the first dielectric material differing from the second dielectric material. In particular, the first dielectric material differs from the second dielectric material through its mechanical, electrical and thermal properties. The use of different dielectric materials for the housing frame and the housing cover results in a multiplicity of degrees of freedom for optimizing the mechanical, electrical and thermal properties of the housing in order to achieve improved reliability of the power module. In particular, the use of different dielectric materials enables a housing which does not significantly impair the service life of the power module even at high temperatures of the power semiconductor.

A further embodiment provides that the housing cover is detachably connected to the housing frame. A reversible connection can be produced, for example, via a non-positive connection between the housing cover and the housing frame. The power unit, for example, can be non-destructively analyzed by means of a housing cover that can be detached from the housing frame in the event of errors occurring in production or In operation.

A further embodiment provides that the housing cover is positively connected to the housing frame. A positive connection is, for example, a snap connection of the housing cover. The snap connection can be produced, for example, via a housing cover which is elastically deformable, at least in the region of the snap connection, and which is hooked into the housing frame to produce the snap connection. By means of a positively connected cover, the power unit, for example, can be analyzed particularly easily in a non-destructive manner in the event of faults occurring in production or in operation.

A further embodiment provides that the first dielectric material has a higher dielectric strength and/or a higher temperature stability than the second dielectric material. As the housing cover has no direct contact with the heat sink heated by the power semiconductor and thus has a lower temperature than the housing frame, a lower temperature stability is sufficient. In particular, when using a soft encapsulation within the housing frame, the housing cover can have a lower dielectric strength than the housing frame. Therefore, a more cost-effective material can be used for the housing cover.

A further embodiment provides that the first dielectric material has a higher mechanical rigidity than the second dielectric material. For example, the housing cover, which comprises the second dielectric material, can be elastically deformed by a lower mechanical rigidity to produce a snap connection to the housing frame.

A further embodiment provides that the first dielectric material contains a reaction resin and/or has a fiber content of 50% to 75%, in particular 60% to 65%. A reaction resin is, for example, an epoxy resin. Glass and/or carbon fibers, for example, are used for the filling, as a result of which a high strength and/or rigidity can be achieved. Furthermore, a high dielectric strength is achieved for the first dielectric material.

A further embodiment provides that the second dielectric material contains a thermoplastic material and/or has a fiber content of 5% to 15%. Such a thermoplastic material is, for example, polycarbonate. Glass and/or carbon fibers, for example, are used for the filling. A high elasticity, for example for producing a snap connection, is achieved for the second dielectric material by means of such a fiber content.

A further embodiment provides that a power board arranged substantially parallel to the surface of the heat sink is connected to the power unit via orthogonal contacts, the housing cover having recesses for passage of the orthogonal contacts. An orthogonal contact is understood to mean, for example, a pin which, as a result of its structural properties, can be arranged perpendicularly on a substrate. Such structural properties are, for example, a foot which allows the pin, for example by means of a substance-to-substance bond with the substrate, to be arranged on the substrate and/or a swash circumference which facilitates finding a bore in the power board and ensures more stability and robustness, for example in the case of thermal expansion during operation. For example, the orthogonal contacts are soldered onto the substrate and connected to the power board by means of a press-fit connection. Such a contact is made, for example, of copper or a copper alloy in order to achieve low resistance and high current-carrying capacity. By means of the perpendicular arrangement of the contacts, short conduction paths and associated low inductances are achieved, which enables power units with low impedances and low losses.

A further embodiment provides that the power board has a metallization, the metallization being at least partially recessed. In particular, the metallization between potentials of different orthogonal contacts is omitted in order to maintain the required air and creepage distances.

BRIEF DESCRIPTION OF THE DRAWING

The invention is described and explained in more detail hereinafter with reference to the exemplary embodiments shown in the figures.

It is shown in.

DETAILED DESCRIPTION OF PREFERRED EMBODIMENTS

Figure 1:
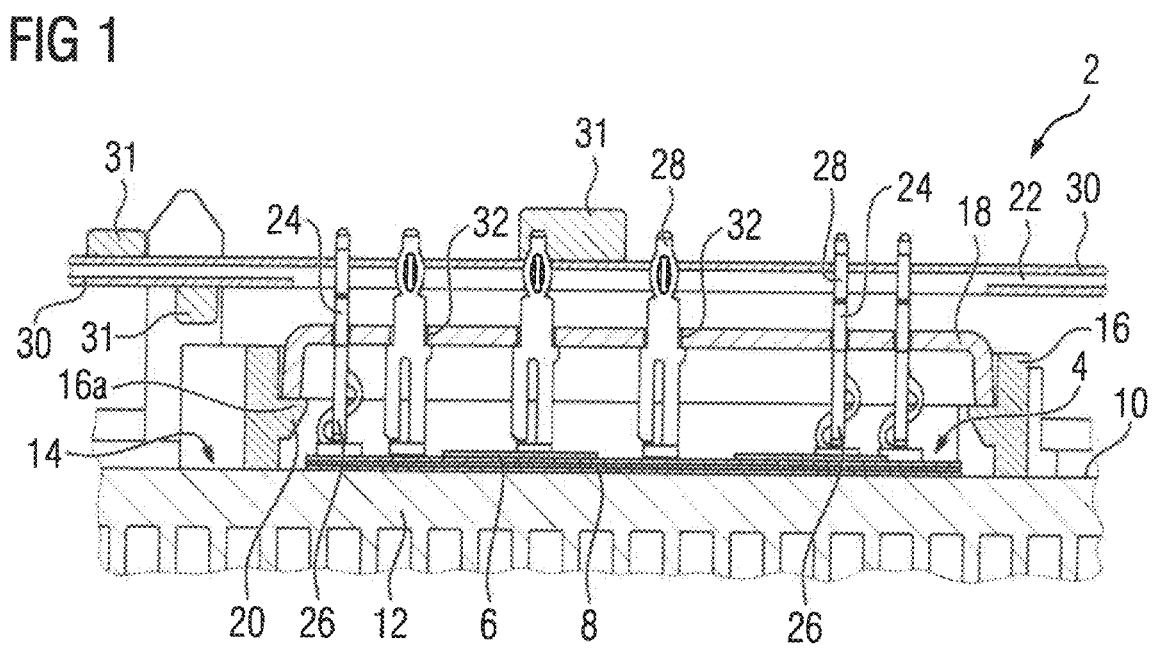
FIG. 1 a diagrammatic view of a power module in cross-section.

The exemplary embodiments explained hereinafter are preferred embodiments of the invention. In the exemplary embodiments, the described components of the embodiments each represent individual features of the invention which are to be considered independently of one another, and which in each case also further develop the invention independently of one another and are thus also to be regarded individually or in a combination other than the combination shown as part of the invention. Furthermore, the embodiments described can also be supplemented by further features of the invention already described.

The same reference characters have the same meaning in the various figures.

FIG. 1 shows a diagrammatic view of a power module 2 in cross-section. The power module 2 has at least one power unit 4, which comprises a power semiconductor 6 and a substrate 8. The power semiconductor 6 is designed, for example, as a transistor, in particular as an insulated gate bipolar transistor (IGBT), as a metal oxide semiconductor field effect transistor (MOSFET) or as a field effect transistor, or as a diode. In particular, at least one transistor is assigned an antiparallel diode.

The substrate 8 of the at least one power unit 4 has a dielectric material layer with a thickness of 25 µm to 400 µm, in particular 50 µm to 250 µm, which contains a ceramic material, for example aluminum nitride or aluminum oxide, or an organic material, for example a polyamide. Furthermore, the substrate 8 has a metallization on both sides, in particular a structured metallization, which is made of, for example, copper, the substrate 8 being directly connected in an integrally bonded manner to a surface 10 of a heat sink 12 via the metallization. The heat sink 12 is made of, for example, aluminum or an aluminum alloy by extrusion. The substance-to-substance bond to the heat sink 12 is produced by soldering or sintering. Direct substance-to-substance bonding is understood to mean direct bonding, which includes connecting means for producing the substance-to-substance bond, such as adhesive, solder, sintering paste, etc., but excludes an additional connecting element such as an additional conductor, a bonding wire, a spacer, a base plate, heat-conducting paste, etc.

The at least one power unit 4 is surrounded by a housing 14, the housing 14 comprising a housing frame 16 formed from a first dielectric material and a housing cover 18 formed from a second dielectric material, the housing 14 being closed by connecting the housing cover 18 to the housing frame 16. Furthermore, the housing cover 18 is non-positively and detachably connected to the housing frame 16 by a protrusion 16*a*. The housing frame 16 is connected liquid-tight to the surface 10 of the heat sink 12. The housing 14 is filled to just below the housing cover 18 with a soft encapsulation 20, in particular a silicone encapsulation.

The first dielectric material differs from the second dielectric material, the first dielectric material having a higher dielectric strength and/or a higher temperature stability than the second dielectric material. Furthermore, the first dielectric material has a higher mechanical rigidity than the second dielectric material.

For example, the first dielectric material contains a reaction resin, in particular epoxy resin, which is filled with a fiber content of 50% to 75%, in particular 60% to 65%. On the other hand, the second dielectric material contains, for example, a thermoplastic material, which is filled with a fiber content of 5% to 15%. Glass and/or carbon fibers, for example, are used for the filling.

A power board 22 arranged substantially parallel to the surface 10 of the heat sink 12 is connected to the power unit 4 via orthogonal contacts 24, the orthogonal contacts 24 being connected in an integrally bonded manner to the substrate 8 of the power unit 4. The orthogonal contacts 24 have an elastically yielding section 26 and are, for example, connected to the power board 22 with a press-fit connection 28. The power board 22 has a metallization 30, in particular on both sides, the metallization 30 being at least partially recessed in order to maintain the required air and creepage distances on the power board 22. In particular, a metallization 30 is recessed between potentials of different orthogonal contacts 24 in order to maintain the required air and creepage distances. The housing cover 18 has recesses 32 for passage of the orthogonal contacts 24.

Figure 2:
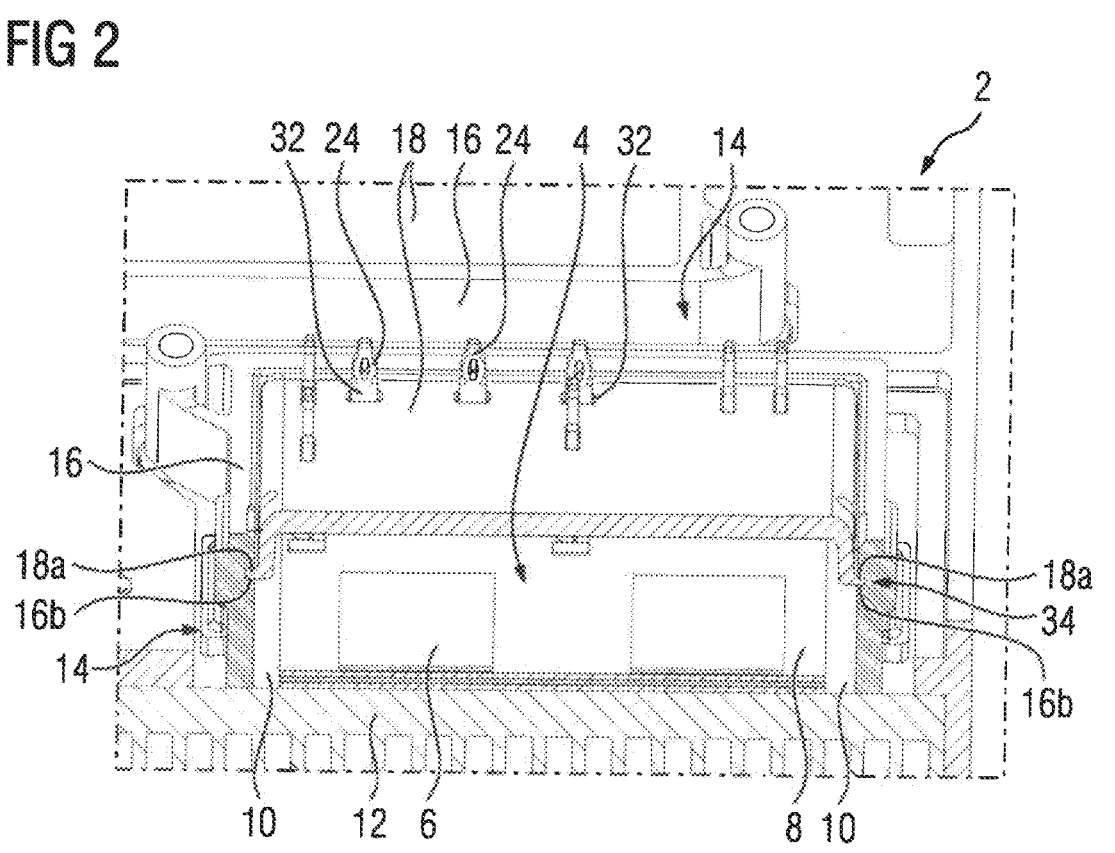
FIG. 2 a diagrammatic three-dimensional sectional view of a power module.

FIG. 2 shows a diagrammatic three-dimensional sectional view of a power module 2. The power module 2 comprises at least two power units 4. The housing cover 18 of the respective power unit 4 is positively and detachably connected to the housing frame 16 by a snap connection 34. The snap connection is produced by way of example via a housing cover 18 which is elastically deformable, at least in the region of the snap connection, and which is hooked into the housing frame 16, at least on two opposite sides, to produce the snap connection. In particular, a nose 18*a* of the housing cover 18 is hooked into a groove 16*b* In the housing frame 16. The power board 22 is not shown for reasons of clarity. The further embodiment of the power module 2 in FIG. 2 corresponds to that in FIG. 1.

Figures 3, 4:
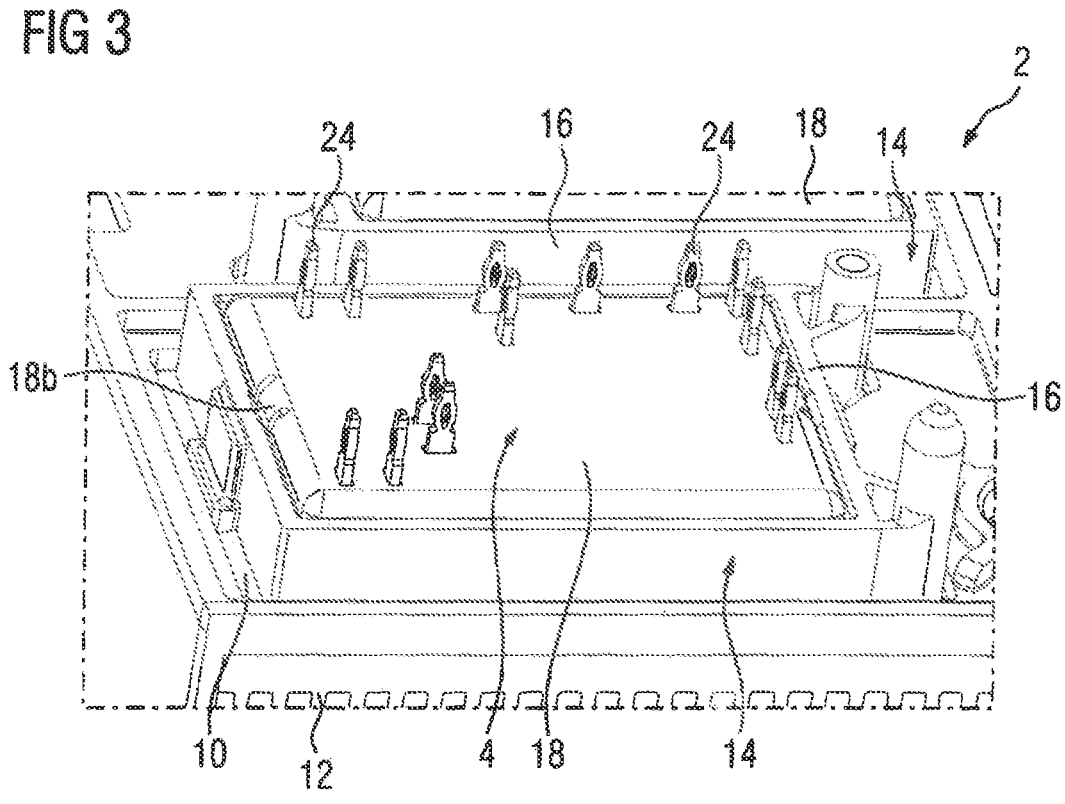
FIG. 3 a diagrammatic three-dimensional view of a power module.
FIG. 4 a diagrammatic view of a power converter with a power module.

FIG. 3 shows a diagrammatic three-dimensional view of a power module 2, an elastic region 18*b* of the housing cover 18 for producing a detachable positive connection with the housing frame 16 being shown. The embodiment of the power module 2 in FIG. 3 corresponds to that in FIG. 2.

FIG. 4 shows a diagrammatic view of a power converter 36 with a power module 2. The power converter 36 may comprise more than one power module 2.

In summary, the invention relates to a power module 2 having at least one power unit 4, which comprises at least one power semiconductor 6 and a substrate 8. In order to improve the reliability of the power module 2, it is proposed that the substrate 8 of the power unit 4 is directly connected in an integrally bonded manner to a surface 10 of a heat sink 12, the at least one power unit 4 being surrounded at least partially by a housing 14, the housing 14 comprising a housing frame 16 formed from a first dielectric material and a housing cover 18 formed from a second dielectric material, the first dielectric material differing from the second dielectric material, and the housing frame 16 being connected liquid-tight to the surface 10 of the heat sink 12, and the housing 14 being closed by connecting the housing cover 16 to the housing frame 16.

The invention claimed is:

1. A power module, comprising:
   a power unit comprising a power semiconductor and a substrate, said substrate directly connected in an integrally bonded manner to a surface of a heat sink; and
   a housing at least partially surrounding the power unit and comprising a housing frame which is connected liquid-tight to the surface of the heat sink and is formed from a first dielectric material, and a housing cover which is configured to close the housing and is detachably connected to the housing frame in a non-destructive manner, said housing cover formed from a second dielectric material which differs from the first dielectric material, wherein the first dielectric material has a higher dielectric strength, a higher temperature stability, and a higher mechanical rigidity than the second dielectric material.

2. The power module of claim 1, wherein the housing cover is detachably connected to the housing frame in a non-positive connection at a protrusion formed on the housing frame.

3. The power module of the claim 1, wherein the housing cover is detachably connected to the housing frame in a positive connection by a snap connection produced by an elastically deformable region of the lower mechanical rigidity housing cover which is hooked into the housing frame.

4. The power module of claim 1, wherein the first dielectric material contains a reaction resin and/or has a fiber content of 50% to 75%.

5. The power module of claim 1, wherein the first dielectric material contains a reaction resin and/or has a fiber content of 60% to 65%.

6. The power module of claim 1, wherein the second dielectric material contains a thermoplastic material and/or has a fiber content of 5% to 15%.

7. The power module of claim 1, further comprising:
   a power board arranged primarily parallel to the surface of the heat sink;
   orthogonal contacts connecting the power board to the power unit;
   wherein the housing cover has recesses for passage of the orthogonal contacts.

8. The power module of claim 7, wherein the power board comprises a metallization which is at least partially recessed.

9. A power converter, comprising the power module of claim 1.

10. A method for producing a power module comprising a power unit, the method comprising:
   directly connecting in an integrally bonded manner a substrate of the power unit to a surface of a heat sink;
   arranging a housing around the power unit, wherein the housing comprises a housing frame formed from a first dielectric material and a housing cover formed from a second dielectric material which differs from the first dielectric material, wherein the first dielectric material has a higher dielectric strength, a higher temperature stability, and a higher mechanical rigidity than the second dielectric material;

connecting the housing frame liquid-tight to the surface of the heat sink; and closing the housing by detachably connecting the housing cover to the housing frame in a non-destructive manner.

11. The method of claim 10, further comprising positively connecting the housing cover to the housing frame by a snap connection produced by an elastically deformable region of the lower mechanical rigidity housing cover which is hooked into the housing frame.

12. The method of claim 10, further comprising detachably connecting the housing cover to the housing frame in a non-positive connection at a protrusion formed on the housing frame.

13. The method of claim 10, further comprising:

arranging a power board essentially parallel to the surface of the heat sink;

forming the housing cover with recesses for passage of orthogonal contacts; and connecting the power board to the power unit via the orthogonal contacts.

14. The power module of claim 1, further comprising a soft encapsulation provided within the housing frame.

15. The power module of claim 14, wherein the housing is filled to just below the housing cover with the soft encapsulation.

16. The method of claim 10, further comprising providing a soft encapsulation within the housing frame.

17. The method of claim 10, wherein the housing is filled to just below the housing cover with the soft encapsulation.

\* \* \* \* \*